(12) United States Patent
Shin

(10) Patent No.: US 8,854,094 B2
(45) Date of Patent: Oct. 7, 2014

(54) PHASE LOCKED LOOP

(75) Inventor: Young Joon Shin, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 727 days.

(21) Appl. No.: 12/077,894

(22) Filed: Mar. 21, 2008

(65) Prior Publication Data
US 2009/0237131 A1 Sep. 24, 2009

(51) Int. Cl.
*H03L 7/06* (2006.01)
*H03L 7/089* (2006.01)
*H03L 7/093* (2006.01)
*H03L 7/18* (2006.01)

(52) U.S. Cl.
CPC ............ *H03L 7/0893* (2013.01); *H03L 7/18* (2013.01); *H03L 7/093* (2013.01)
USPC .......................................... 327/156; 327/147

(58) Field of Classification Search
USPC ................ 327/147, 151, 152, 156, 160, 163
See application file for complete search history.

(56) References Cited

U.S. PATENT DOCUMENTS

| | | | |
|---|---|---|---|
| 5,821,789 A * | 10/1998 | Lee | 327/156 |
| 6,100,766 A * | 8/2000 | Segawa et al. | 331/2 |
| 6,504,438 B1 * | 1/2003 | Li et al. | 331/17 |
| 6,600,351 B2 * | 7/2003 | Bisanti et al. | 327/157 |
| 6,611,161 B1 * | 8/2003 | Kumar et al. | 327/157 |
| 7,135,900 B2 * | 11/2006 | Sohn | 327/148 |
| 7,283,004 B2 * | 10/2007 | Guenais | 331/17 |
| 7,358,827 B2 * | 4/2008 | Sohn et al. | 331/185 |
| 7,443,249 B2 * | 10/2008 | Song | 331/17 |
| 7,545,223 B2 * | 6/2009 | Watanabe | 331/17 |
| 7,595,671 B2 * | 9/2009 | Watanabe | 327/156 |
| 2007/0018736 A1 * | 1/2007 | Sohn et al. | 331/16 |
| 2008/0068090 A1 * | 3/2008 | Watanabe | 331/10 |
| 2008/0101521 A1 * | 5/2008 | Lee et al. | 375/371 |
| 2008/0265959 A1 * | 10/2008 | Kimura | 327/156 |
| 2009/0033429 A1 * | 2/2009 | Song | 331/17 |
| 2009/0066446 A1 * | 3/2009 | Sahu et al. | 333/172 |
| 2009/0137211 A1 * | 5/2009 | Stengel et al. | 455/76 |
| 2009/0160560 A1 * | 6/2009 | Song et al. | 331/17 |
| 2009/0160565 A1 * | 6/2009 | Kawamoto | 331/1 A |
| 2009/0167386 A1 * | 7/2009 | Song | 327/157 |

* cited by examiner

*Primary Examiner* — Adam Houston
(74) *Attorney, Agent, or Firm* — Oblon, Spivak, McClelland, Maier & Neustadt, L.L.P.

(57) ABSTRACT

A disclosed exemplary embodiment is a phase locked loop comprising a main charge pump driven by a phase error signal, and providing a first input to a loop filter. An auxiliary charge pump driven by the phase error signal feeds a second input of the loop filter. The loop filter can be an active loop filter comprising an operational amplifier and a feedback RC network. The first input of the active loop filter can be an inverting input of the operational amplifier and the second input can be a non-inverting input of the operational amplifier. An on-chip stabilizing capacitor fed by the auxiliary charge pump and coupled to the second input of the loop filter is significantly smaller than the conventional stabilizing capacitors. The loop filter outputs a regulating voltage for regulating the oscillation frequency of a voltage controlled oscillator in the phase locked loop.

20 Claims, 3 Drawing Sheets

US 8,854,094 B2

PHASE LOCKED LOOP

BACKGROUND OF THE INVENTION

1. Field of the Invention

The present invention is generally in the field of electrical circuits. More particularly, the present invention relates to phase locked loop circuits.

2. Background Art

Phase locked loops (PLLs) can be used in electronic circuits to generate high frequency signals that are multiples of lower frequency reference signals. A PLL configured in this fashion can be part of a circuit for generating a local oscillation frequency for downconverting a received radio frequency (RF) signal to a baseband frequency. The RF signal can be combined with the PLL output in a mixer, where the mixer output signal will be a downconverted baseband signal. Typically, the desired RF signal to be downconverted will be adjacent to other RF signals with frequencies near the desired RF signal. If the PLL output has a large loop bandwidth, and thus a high phase noise, the adjacent RF signals near the desired RF signal will also be downconverted to the baseband frequency, thereby corrupting the desired signal. Thus, it is desirable for PLLs to exhibit low phase noise, when the received RF signals are in close proximity, for example in television applications.

According to conventional techniques for reducing the PLL loop bandwidth, and thus reducing the PLL output phase noise, a loop filter component of the PLL is designed with a large stabilizing capacitor. For a PLL implemented as an integrated circuit, the utilization of a large stabilizing capacitor imposes design difficulties. The large stabilizing capacitor may be designed into the integrated circuit, which uses significant die space, or the large stabilizing capacitor may be located off-chip, which imposes additional pin-out, component count, and an additional bill-of-materials item.

Thus, there is a need in the art for a solution to reduce PLL phase noise, while avoiding the disadvantages inherent in conventional solutions.

SUMMARY OF THE INVENTION

A phase locked loop, substantially as shown in and/or described in connection with at least one of the figures, and as set forth more completely in the claims.

DETAILED DESCRIPTION OF THE INVENTION

The present invention is directed to a phase locked loop. Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely exemplary embodiments of the invention. To maintain brevity, other embodiments of the invention, which use the principles of the present invention are not specifically described in the present application and are not specifically illustrated by the present drawings.

Figure 1:
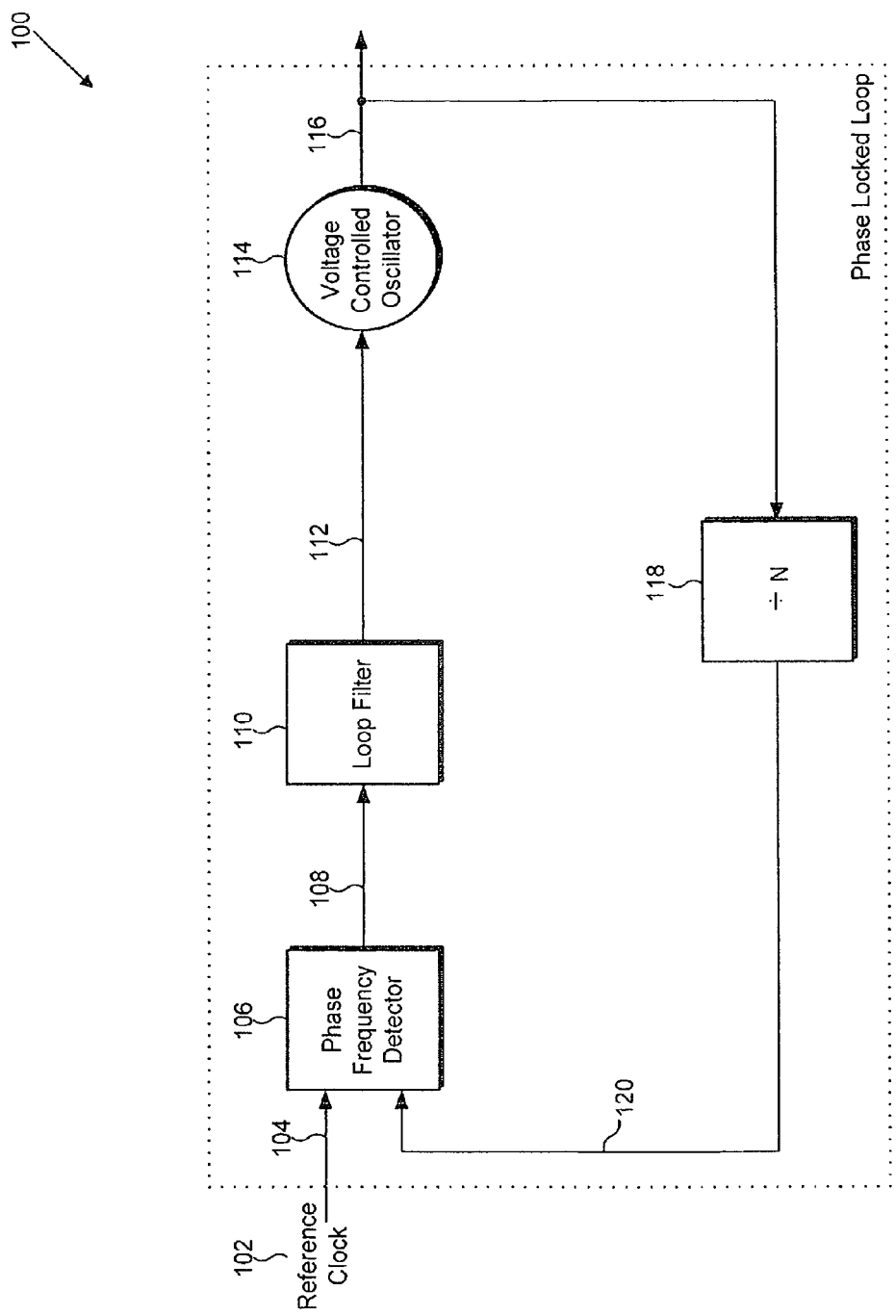
FIG. 1 shows a conventional phase locked loop.

Conventional phase locked loop (PLL) 100 is shown in FIG. 1. PLL 100 includes reference clock 102, phase frequency detector (PFD) 106, loop filter 110, voltage controlled oscillator (VCO) 114, and divide by N 118. PFD 106 is coupled to the output of reference clock 102 via line 104 and to the output of divide by N 118 via line 120. Loop filter 110 is coupled to the output of PFD 106 via line 108, VCO 114 is coupled to the output of loop filter 110 via line 112, and divide by N 118 is coupled to the output of VCO 114 via line 116.

Reference clock 102 can be, for example, a crystal oscillator configured to generate a fixed-frequency signal. Divide by N 118 can be configured to generate, for example, a frequency divided feedback signal. PFD 106, which may be, for example, a conventional phase frequency detector, can be configured to compare the phases of the outputs of reference clock 102 and divide by N 118 and to generate a phase error signal on line 108. The phase error signal can be configured to represent, for example, the difference in phase or frequency between the input signals of PFD 106.

Loop filter 110 can be configured to filter out the unwanted high-frequency glitches or components outputted by PFD 106. To do so, loop filter 110 is implemented as a passive low-pass filter including a large stabilizing capacitor in conventional PLL 100. So implemented, the phase noise in PLL 100 output can be influenced by the value of the large stabilizing capacitor. After filtering the phase error signal on line 108, loop filter 110 outputs a regulating signal to VCO 114 on line 112.

VCO 114 can be configured receive the regulating signal on line 112 and to generate, for example, an oscillator signal that tracks the output of reference clock 102 and is generally a multiple thereof. If the regulating signal voltage outputted by loop filter 110 is constant, for example, then VCO 114 can output a constant-frequency oscillator signal. However, if the regulating signal voltage increases or decreases, VCO 114 can output an oscillator signal with a frequency that increases or decreases in proportion, so as to remain a generally accurate multiple of the frequency of reference clock 102. The output of VCO 114 can be utilized as the output of PLL 100 on line 116, and can also be provided as feedback to PFD 106 through divide by N 118.

Divide by N 118 can be configured, for example, to receive the oscillator signal from line 116, divide the frequency of the oscillator signal by factor of N, and output a feedback signal to PFD 106 on line 120. For example, if divide by N 118 divides by 2, then the feedback signal frequency will be half the frequency of the VCO 114 oscillator signal, and the VCO 114 oscillator signal will thus track the output of reference clock 102 at double the reference clock 102 frequency. By configuring divide by N 118 to divide the oscillator signal by various values of N, VCO 114 can be made to track various multiples of the output of reference clock 102.

Figure 2:
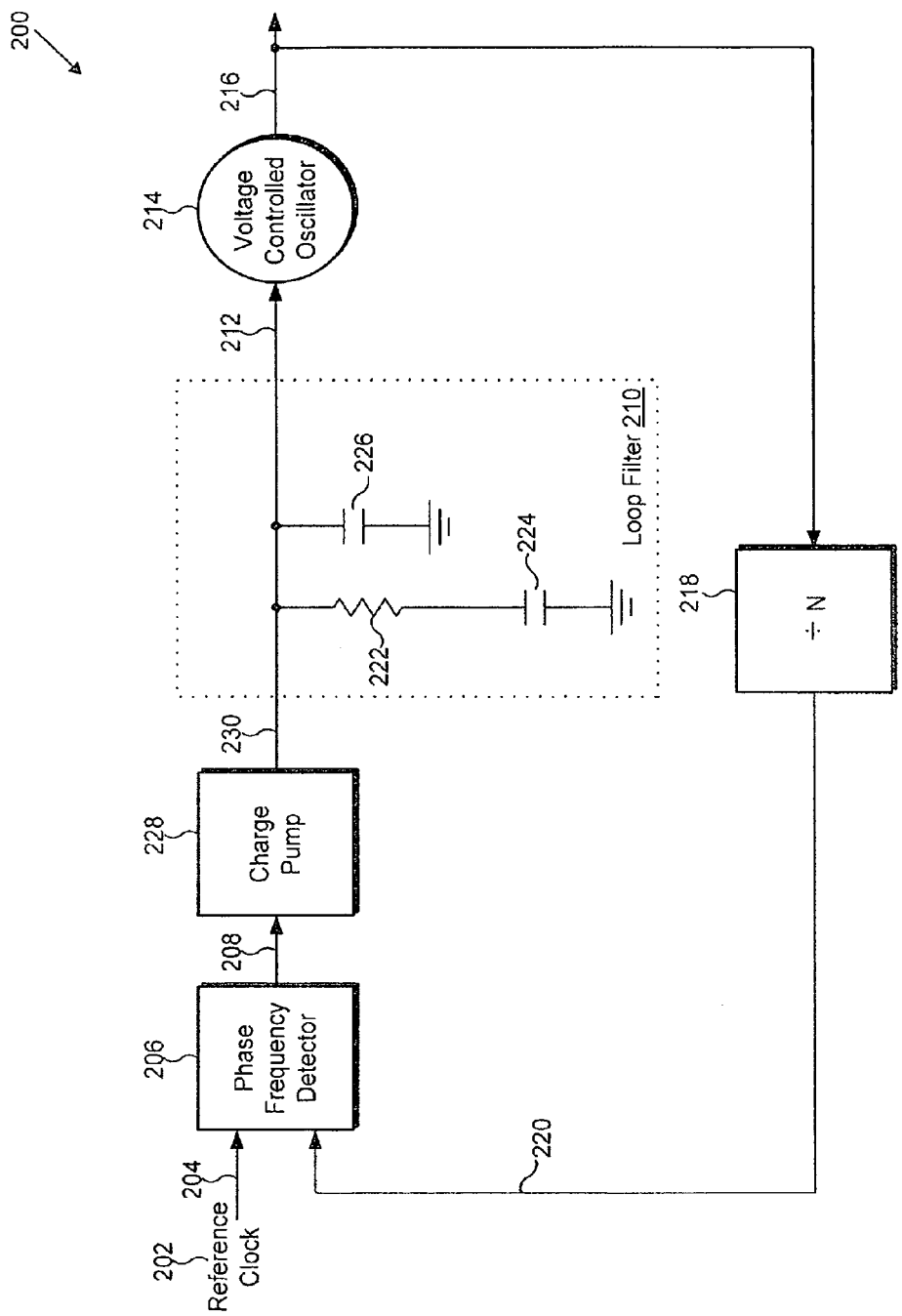
FIG. 2 shows a conventional phase locked loop, with a loop filter using a large off-chip stabilizing capacitor.

FIG. 2 shows conventional phase locked loop (PLL) 200. Reference clock 202, phase frequency detector (PFD) 206, loop filter 210, voltage controlled oscillator (VCO) 214, and divide by N 218 correspond to reference clock 102, PFD 106, loop filter 110, VCO 114, and divide by N 118, respectively, of PLL 100. Notably, PLL 200 shows charge pump 228, and internal components of loop filter 210. Loop filter 210, which can be a passive loop filter, includes filtering resistor 222, filtering capacitor 226, and stabilizing capacitor 224.

Like corresponding components in PLL 100, reference clock 202 can be configured to generate, for example, a fixed-frequency signal on line 204, while divide by N 218 can be configured to generate, for example, a frequency divided feedback signal on line 220. PFD 206 can be configured to compare the phases of the outputs of reference clock 202 and divide by N 218, and to generate a phase error signal on line 208 that may include an additional unwanted high-frequency component.

Charge pump 228 may comprise, for example, a circuit that uses capacitors switching at high frequencies to produce a voltage at charge pump output 230 that corresponds to the charge pump input voltage. In this embodiment, charge pump 228 receives the output of PFD 206 on line 208 and generates charge pump output 230 corresponding to PFD 206 phase error signals. The output of charge pump 228 may also include unwanted high-frequency components originating from output 208 of PFD 206, as well as high-frequency noise generated by charge pump 228 itself.

Loop filter 210 can be configured to receive the output of charge pump 228 on line 230. Loop filter 210 includes a low pass filter comprising filter resistor 222 and filter capacitor 226, and also includes stabilizing capacitor 224. Filtering resistor 222 and filtering capacitor 226 can be configured to filter out the unwanted high-frequency component originating from PFD 206 and other high-frequency noise otherwise present in the output of charge pump 228. Additionally, stabilizing capacitor 224 can be configured to hold the charge pump output voltage at node 230 corresponding to PFD 206 phase error signals inputted to charge pump 228. Loop filter output 212 is provided to VCO 214 to regulate the oscillation frequency of VCO 214, which is provided at output 216 of PLL 200.

VCO 214 can be configured to receive the regulating voltage at output 212 of loop filter 210 and to generate an oscillator signal that tracks the frequency of reference clock 202. If loop filter 210 outputs a constant-voltage regulating signal, for example, then VCO 214 can output a constant-frequency oscillator signal, but if the regulating voltage at line 212 increases or decreases, VCO 214 will output an oscillator signal with a frequency that increases or decreases in proportion. The oscillator signal of VCO 214 can be utilized as output 216 of PLL 200, and can also be provided as feedback to PFD 206 through divide by N 218.

Divide by N 218 can be configured, for example, to receive the VCO 214 oscillator signal on line 216, divide the frequency of the oscillator signal by N, and output a feedback signal to PFD 206 on line 220. For example, if N is equal to 2, divide by N 218 provides a feedback signal on line 220 at half the frequency of the VCO 214 oscillator signal. The VCO 214 oscillator signal will thus track the output of reference clock 202 at double the frequency of reference clock 202. By configuring divide by N 218 to divide the oscillator signal by various values of N, VCO 214 can generate various multiples of the frequency of reference clock 202.

The loop bandwidth of PLL 200 is inversely proportional to the capacitance of stabilizing capacitor 224 of loop filter 210. Thus, conventional techniques for reducing PLL 200 loop bandwidth, and thus reducing PLL 200 output phase noise, typically require stabilizing capacitor 224 to have a large capacitance. If PLL 200 is implemented as an integrated circuit, the utilization of a large stabilizing capacitor imposes design difficulties. The large stabilizing capacitor may be designed into the integrated circuit, which uses significant die space, or the large stabilizing capacitor may be located off-chip, which imposes an additional pin-out, component count, and an additional bill-of-materials item.

Figure 3:
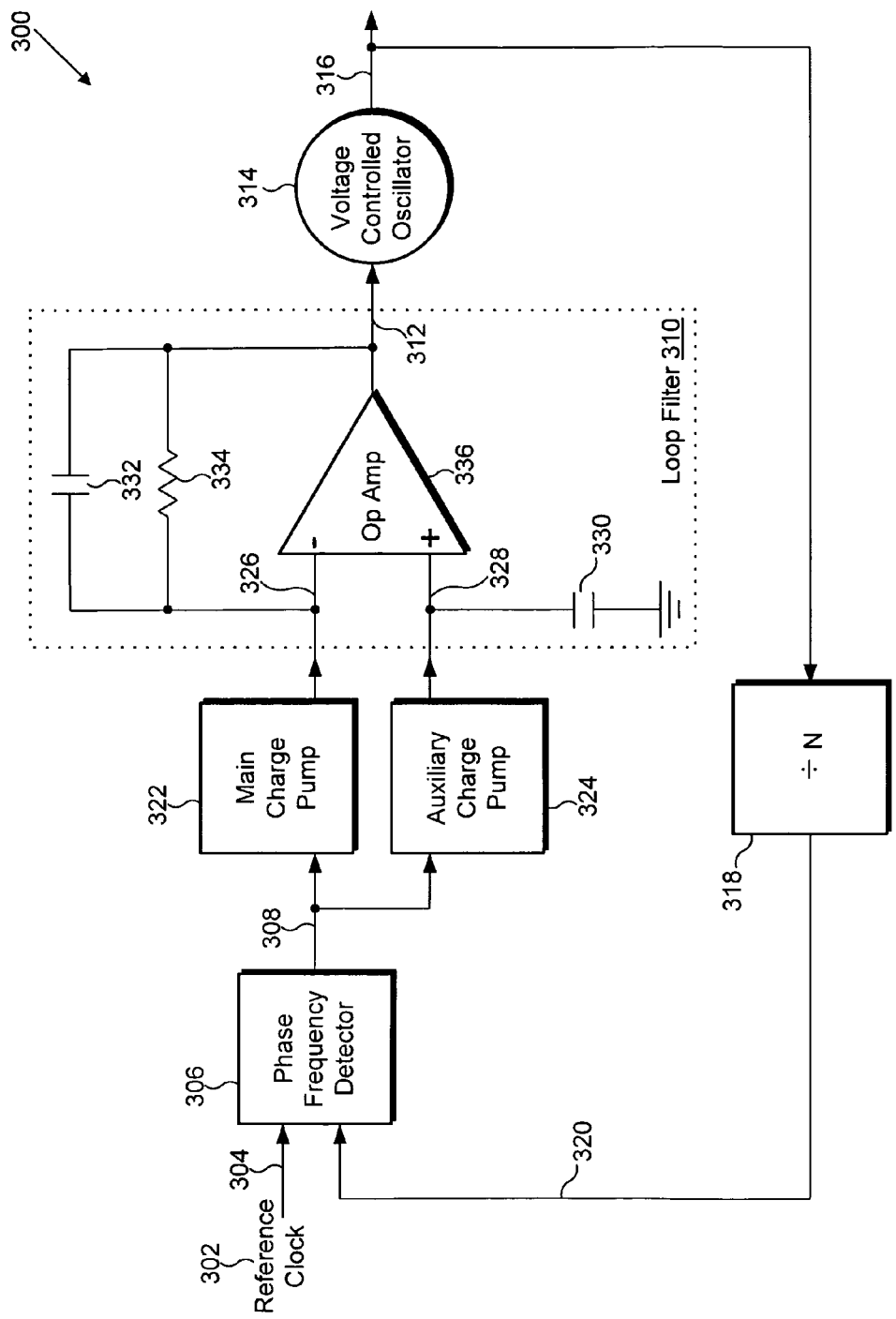
FIG. 3 shows a phase locked loop according to one embodiment of the present invention.

FIG. 3 shows an exemplary phase locked loop (PLL) 300 according to one embodiment of the invention. Reference clock 302, phase frequency detector (PFD) 306, main charge pump 322, voltage controlled oscillator (VCO) 314, and divide by N 318 correspond to reference clock 202, PFD 206, charge pump 228, VCO 214, and divide by N 218, respectively, of PLL 200. Notably, the present invention's PLL 300 includes auxiliary charge pump 324, and loop filter 310. Loop filter 310, which can be an active loop filter, includes filtering resistor 334, filtering capacitor 332, stabilizing capacitor 330, and operational amplifier (op-amp) 336.

As shown in FIG. 3, PFD 306 receives inputs on lines 304 and 320 from reference clock 302 and divide by N 318, respectively, which can be configured to generate, for example, a fixed-frequency signal and a frequency divided feedback signal, respectively. In a fashion similar to PFD 206, PFD 306 can be configured to compare the phases of reference clock 302 and divide by N 318 to generate a phase error signal on line 308 that may include an additional unwanted high-frequency component.

Main and auxiliary charge pumps 322 and 324 can be configured to receive the output of PFD 306 on line 308, and can each be implemented, for example, as a circuit that utilizes capacitors switching at high frequencies to produce respective voltages at charge pump outputs 326 and 328 that correspond to phase error signals outputted by PFD 306 on line 308. Main charge pump 322 is typically configured to be a similar size to charge pump 228, while auxiliary charge pump 324 is configured to be smaller than charge pump 228. For example, auxiliary charge pump 324 may be one hundred times smaller than charge pump 228 and main charge pump 322.

Main charge pump 322 is coupled to the inverting input of op-amp 336 via line 326, and auxiliary charge pump 324 is coupled to the non-inverting input of op-amp 336 via line 328. Stabilizing capacitor 330 is coupled to the output of auxiliary charge pump 324 and is typically much smaller than stabilizing capacitor 224 in conventional PLL 200. For example, stabilizing capacitor 330 may be one hundred times smaller than stabilizing capacitor 224. In the present embodiment, a feedback RC network, including filtering resistor 334 and filtering capacitor 332, is coupled between the output of main charge pump 322 (i.e. the inverting input of op-amp 336 on line 326) and the output of op-amp 336 on line 312. The output of op-amp 336 on line 312 is also provided to VCO 314 as a regulating voltage.

VCO 314 can be configured to receive the regulating voltage at output 312 of loop filter 310 and to generate an oscillator signal that tracks the frequency of reference clock 302. If loop filter 310 outputs a constant-voltage regulating signal, for example, then VCO 314 can output a constant-frequency oscillator signal, but if the regulating voltage at line 312 increases or decreases, VCO 314 will output an oscillator signal with a frequency that increases or decreases in proportion. The oscillator signal of VCO 314 can be utilized as output 316 of PLL 300, and can also be provided as feedback to PFD 306 through divide by N 318.

Divide by N 318 can be configured, for example, to receive the VCO 314 oscillator signal on line 316, divide the frequency of the oscillator signal by N, and output a feedback signal to PFD 306 on line 320. For example, if N is equal to 2, divide by N 318 provides a feedback signal on line 320 at half the frequency of the VCO 314 oscillator signal. The VCO 314 oscillator signal will thus track the output of reference clock 302 at double the frequency of reference clock 302. By configuring divide by N 318 to divide the oscillator signal by various values of N, VCO 314 can generate various multiples of the frequency of reference clock 302.

In operation, PFD 306 of PLL 300 can compare the output of reference clock 302 with the output of divide by N 318, which is a frequency divided version of the oscillator signal of VCO 314. Based on the comparison, PFD 306 outputs phase error signals on line 308. Main and auxiliary charge pumps 322 and 324 receive the phase error signals, and generate respective output voltages on lines 326 and 328 corresponding to the phase error signals outputted by PFD 306 on line 308. The outputs of main and auxiliary charge pumps 322 and 324 may also include unwanted high-frequency components originating from PFD 306, as well as high-frequency noise generated by charge pumps 322 and 324.

Loop filter 310 receives the output of auxiliary charge pump 324 on line 328. Stabilizing capacitor 330, which is coupled to line 328, holds the output of auxiliary charge pump 324 corresponding to PFD 306 phase error signals outputted on line 308. Notably, even though auxiliary charge pump 324 is smaller than charge pump 228, stabilizing capacitor 330 can charge up in the same amount of time required to charge up stabilizing capacitor 226, because stabilizing capacitor 330 has also been proportionally reduced in size. Thus, stabilizing capacitor 330, while being much smaller than conventional stabilizing capacitor 226, holds a stable and suitable voltage on line 328 at the non-inverting input of op-amp 336.

Loop filter 310 receives the output of main charge pump 322 on line 326, which is coupled to the inverting input of op-amp 336. Due to the high gain of op-amp 336, line 326 is forced to have the same voltage as line 328, where stabilizing capacitor 330 holds a voltage derived from auxiliary charge pump 324. Line 326 is also coupled to the feedback RC network, comprising filtering resistor 334 and filtering capacitor 332, which provides high frequency noise filtering and negative feedback for op-amp 336. In this configuration, op-amp 336, filtering resistor 334, and filtering capacitor 332 act as an active low-pass filter which, among other things, filters unwanted high-frequency components outputted by PFD 306 as well as high-frequency noise generated by main and auxiliary charge pumps 322 and 324. The output of loop filter 310 on line 312 is a regulating voltage that properly adjusts the oscillation frequency of VCO 314.

VCO 314 receives the regulating voltage on line 312 and generates an oscillator signal that tracks the output of reference clock 302. The oscillator signal of VCO 314 is provided as feedback to PFD 306 through divide by N 318, and is also utilized as the output of PLL 300. The output of PLL 300 on line 316 exhibits low phase noise, despite the significantly reduced size of stabilizing capacitor 330 compared to conventional stabilizing capacitor 224. Additionally, stabilizing capacitor 330 is small enough to be integrated on a die with other PLL 300 components, which results in reduced manufacturing and assembly costs and higher manufacturing throughput.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, a phase locked loop has been described.

The invention claimed is:

1. A phase locked loop comprising:
   a main charge pump driven by a phase error signal and feeding a first input of a loop filter;
   an auxiliary charge pump driven by said phase error signal and feeding a second input of said loop filter, said auxiliary charge pump being smaller than said main charge pump;
   an on-chip stabilizing capacitor fed by said auxiliary charge pump and coupled to said second input of said loop filter;
   said loop filter providing a regulating voltage for regulating a frequency of a voltage controlled oscillator in said phase locked loop.

2. The phase locked loop of claim 1 wherein said loop filter comprises an active loop filter.

3. The phase locked loop of claim 2 wherein said active loop filter comprises an operational amplifier.

4. The phase locked loop of claim 3 wherein said first input of said loop filter is an inverting input of said operational amplifier.

5. The phase locked loop of claim 3 wherein said second input of said loop filter is a non-inverting input of said operational amplifier.

6. The phase locked loop of claim 3 wherein a feedback RC network is coupled across an output and an inverting input of said operational amplifier.

7. The phase locked loop of claim 6 wherein said feedback RC network comprises one resistor and one capacitor.

8. The phase locked loop of claim 1 wherein an output of said voltage controlled oscillator is coupled to a divide by N.

9. The phase locked loop of claim 8 wherein an output of said divide by N and a reference clock are fed to a phase frequency detector.

10. The phase locked loop of claim 9 wherein said phase frequency detector generates said phase error signal by comparing a phase of said output of said divide by N with a phase of said reference clock.

11. The phase locked loop of claim 1 wherein said main charge pump and said auxiliary charge pump produce respective output voltages corresponding to said phase error signal.

12. A low phase noise PLL comprising:
    a main charge pump driven by a phase error signal and feeding a first input of an active loop filter;
    an auxiliary charge pump driven by said phase error signal and feeding a second input of said active loop filter, said auxiliary charge pump being smaller than said main charge pump;
    an on-chip stabilizing capacitor fed by said auxiliary charge pump and coupled to said second input of said active loop filter;
    said active loop filter providing a regulating voltage for regulating a frequency of a voltage controlled oscillator in said low phase noise PLL.

13. The low phase noise PLL of claim 12 wherein said active loop filter comprises an operational amplifier.

14. The low phase noise PLL of claim 13 wherein said first input of said active loop filter is an inverting input of said operational amplifier.

15. The low phase noise PLL of claim 13 wherein said second input of said active loop filter is a non-inverting input of said operational amplifier.

16. The low phase noise PLL of claim 13 wherein a feedback RC network is coupled across an output and an inverting input of said operational amplifier.

17. The low phase noise PLL of claim 16, wherein said feedback RC network comprises one resistor and one capacitor.

18. The low phase noise PLL of claim 12 wherein an output of said voltage controlled oscillator is coupled to a divide by N.

19. The low phase noise PLL of claim 18 wherein an output of said divide by N and a reference clock are fed to a phase frequency detector.

20. The low phase noise PLL of claim 19 wherein said phase frequency detector generates said phase error signal by comparing a phase of said output of said divide by N with a phase of said reference clock.

* * * * *